US 6,691,264 B2

(12) United States Patent
Huang

(10) Patent No.: US 6,691,264 B2
(45) Date of Patent: Feb. 10, 2004

(54) BUILT-IN SELF-REPAIR WRAPPER METHODOLOGY, DESIGN FLOW AND DESIGN ARCHITECTURE

(75) Inventor: Johnnie A. Huang, Santa Clara, CA (US)

(73) Assignee: LSI Logic Corporation, Milpitas, CA (US)

(*) Notice: Subject to any disclaimer, the term of this patent is extended or adjusted under 35 U.S.C. 154(b) by 333 days.

(21) Appl. No.: 09/767,585

(22) Filed: Jan. 22, 2001

(65) Prior Publication Data

US 2002/0136066 A1 Sep. 26, 2002

(51) Int. Cl.[7] .............................. G11C 29/00; G11C 7/00
(52) U.S. Cl. ........................................ 714/723; 365/201
(58) Field of Search ................................ 714/718, 733, 714/723, 741, 11; 717/124, 135; 716/4; 365/201

(56) References Cited

U.S. PATENT DOCUMENTS

| | | | |
|---|---|---|---|
| 5,577,050 A | * 11/1996 | Bair et al. .................... | 714/710 |
| 5,764,878 A | * 6/1998 | Kablanian et al. .............. | 714/7 |
| 5,920,515 A | * 7/1999 | Shaik et al. ................. | 365/200 |
| 5,956,350 A | * 9/1999 | Irrinki et al. ................. | 714/718 |
| 5,987,632 A | * 11/1999 | Irrinki et al. ................. | 714/711 |
| 6,065,134 A | * 5/2000 | Bair et al. ...................... | 714/7 |
| 6,085,334 A | * 7/2000 | Giles et al. .................... | 714/7 |
| 6,230,290 B1 | * 5/2001 | Heidel et al. ................. | 714/718 |
| 6,304,989 B1 | * 10/2001 | Kraus et al. .................. | 714/733 |
| 6,367,042 B1 | * 4/2002 | Phan et al. ................... | 714/733 |
| 6,408,401 B1 | * 6/2002 | Bhavsar et al. ................ | 714/7 |
| 6,415,403 B1 | * 7/2002 | Huang et al. ................. | 714/726 |
| 6,560,740 B1 | * 5/2003 | Zuraski, Jr. et al. ......... | 714/733 |

* cited by examiner

Primary Examiner—Albert Decady
Assistant Examiner—Esaw Abraham
(74) Attorney, Agent, or Firm—Conley, Rose & Tayon

(57) ABSTRACT

A "Wrapper" system and method are presented for integrating built-in self-test (BIST) and built-in self-repair (BISR) functions in a semiconductor memory device. The wrapper reduces the usual dependency of BISR circuitry on the BIST design, so that modifications and enhancements to the BIST may be made without requiring significant changes to the BISR. A generic BIST engine with an extended address range (spanning both the accessible and the redundant rows) is used to test the entirety of memory as a single array, preferably using a checkerboard bit pattern. The memory is tested in two stages, using the same BIST algorithm. In the first stage, faulty rows in each memory portion are identified and their addresses recorded. At the end of the first stage a repair process allocates good redundant rows to replace faulty accessible rows. During the second stage, repair of the accessible memory portion is verified, while defects among the redundant portion are ignored. Compared to existing methods, the new method is believed to greatly simplify the interface between the BIST and the BISR circuitry, reduce the overall size of test and repair circuitry, and provide improved test coverage.

19 Claims, 11 Drawing Sheets

BUILT-IN SELF-REPAIR WRAPPER METHODOLOGY, DESIGN FLOW AND DESIGN ARCHITECTURE

BACKGROUND OF THE INVENTION

1. Field of Invention

This invention relates to semiconductor memory and, more particularly, to test and repair of semiconductor memory.

2. Description of Related Art

Semiconductor memory is a crucial resource in modern computers, being used for data storage and program execution. With the exception of the central processor itself, no other component within the computer experiences as high a level of activity. Traditional trends in memory technology are toward greater density (more memory locations, or "cells," per part), higher speed and improved reliability. To some extent, these goals are inconsistent. For example, as memory density increases, the incidence of defects also rises. As a result, production yields of high-density memory devices with zero defects would be so low as to render them prohibitively costly. However, an alternative to building perfect devices is to include spare memory cells along with the primary memory of the device. Additional internal circuitry detects faulty cells, and swaps good cells for known-bad ones. Therefore, as long as there are sufficiently many working cells to replace the defective ones, a fully functional memory device can be made. The primary memory is sometimes referred to as "accessible memory," and the spare memory as "redundant memory." The techniques for internally detecting faulty memory cells and for replacing them with working cells are commonly referred to as "built-in self-test" (hereinafter "BIST") and "built-in self-repair" (hereinafter "BISR"), respectively. BIST and BISR are instrumental in obtaining acceptable yields in the manufacture of high-performance semiconductor memory.

Conventional memory devices are typically organized as a matrix of rows and columns, in which each individual cell has a unique row/column address. A popular memory architecture incorporating the above-described BIST and BISR techniques configures spare memory locations as redundant rows. Thus, a nominal m×n memory device is actually configured as m rows and n columns of accessible memory, with p rows (and n columns) of redundant memory. Redundant memory rows are not part of the nominal m×n address space of the device, except when used to replace defective accessible memory rows. Circuitry within the memory device itself performs both the test (BIST) and repair functions. During BIST, this circuitry generates test patterns to identify faulty memory locations. Then, during BISR, it reroutes internal connections, circumventing these locations and effectively replacing defective rows of accessible memory with working redundant rows.

Most currently used BIST/BISR methods test not only the accessible memory, but the redundant rows that are swapped in to replace accessible memory locations that have failed. The memory is certified as repairable only if there are enough functional redundant rows to replace every faulty row in the accessible memory; otherwise, it is considered non-repairable. A memory test generally involves writing a specific bit pattern to a range of memory cells, then reading back the values actually stored and comparing them to the desired pattern. In practice, this task is not easily accomplished. There are a variety of failure mechanisms that the BIST algorithm must be able to recognize. The simplest of these, in which memory cells are "stuck" in a particular logic state, are readily detected. Others, such as interaction between adjacent rows or columns of the memory, are less obvious. A memory cell that is susceptible to adjacent row interaction, for example, tends to follow the logic transitions of neighboring cells; this condition would not be apparent, however, if the cell were tested alone. In order to reveal interaction-related failures, memory tests are often conducted using alternating bit patterns in adjacent rows or columns of the memory matrix (commonly referred to as a "checkerboard" pattern).

It is often desirable to incorporate improvements in the BIST to achieve better fault coverage. However, in conventional BIST/BISR methods, the test and repair functions are highly interdependent. Consequently, modification of the BIST algorithm may entail corresponding changes to the BISR mechanism. Therefore, even minor changes to the test algorithm may necessitate difficult or extensive modification of the repair circuitry. In some cases, the modified BIST may be inconsistent with the existing BISR circuitry. The conventional BIST/BISR methodology is too complicated to permit upgrading BISR circuitry to support BIST enhancements.

A typical BIST/BISR method employs two BIST passes (also referred to herein as BIST "stages," or "runs"). In the first pass, the accessible memory is tested row-by-row until a defect is encountered. The row containing the defect is then replaced by the first available redundant row and retested. This process continues until all of the accessible memory has been tested, or until there are no more redundant rows to use as replacements. In the first case, a second BIST run is performed, verifying all of the accessible memory. In the second case, the device is flagged as non-repairable. This method suffers from several drawbacks, among them the fact that the total test time is not predictable. The duration of the test is dependent on the number of bad accessible memory rows, each of which has to be replaced and retested. Since there is no way to know the test time in advance, precise test scheduling during production is impossible.

The data retention test is another critical evaluation of the memory that may be performed by the BIST. This involves writing a test pattern to the memory, waiting for some prescribed interval, and then reading the memory to determine whether the test pattern was retained. The conventional BIST/BISR method is so complicated that it can significantly prolong data retention tests and make the results difficult to evaluate.

In view of the above-mentioned problems, it would be desirable to have a method for built-in self-repair of semiconductor memory devices in which the BISR mechanism is substantially independent of the BIST mechanism, such that changes to the BIST could be accommodated with little or no modification to the BISR. Ideally, the BISR could be integrated with any BIST engine without modification. Under the method, the BISR should be consistent with upgrading fault coverage capability in the BIST, e.g., readily supporting improved versions of tests for adjacent row interaction, data retention, etc. In addition, a system embodying the method should be efficient and permit estimation of total test time.

SUMMARY OF THE INVENTION

The problems outlined above are addressed by a system and method for a self-repairing memory that can be integrated with any BIST mechanism, without extensive modification to either the BIST or BISR mechanisms. A BISR "Wrapper" system interfaces the BIST engine to the BISR repair circuitry. The BISR Wrapper makes use of standard status signals present in any BIST engine, and directs the operation of the BISR circuitry. With the Wrapper, BISR operation need no longer be closely coupled to the operation or internal structure of the BIST. Consequently, modification of the BIST mechanism, e.g., to improve fault coverage, can be implemented without influencing the BISR. This is believed to be an important advantage of the new method, since a major impediment to BIST enhancement is often the collateral effort involved in redesigning the BISR. The new method also has the advantage that test time is consistent and predictable.

The system disclosed herein may be used for self-test and self-repair of a memory comprising first and second arrays. In an embodiment, the system consists of a first m×n memory array, a second p×n memory array, a single built-in self-test (BIST) engine adapted to test the first and second arrays as a single joint array and detect rows failing the test, and repair circuitry. The BIST is configured to generate row addresses that span the entire memory array (i.e., m+n rows). According to this embodiment, the entirety of the memory is tested as a single addressable array, and rows in the first and second arrays that fail the test are detected. The repair circuitry enters the addresses of failing rows into a repair table. The repair table is an internal register, each entry of which is associated with a non-failing row from the second array. Thus, the repair table maps failing rows in the first array to replacement rows in the second array. Once the repair table has been created, the repair circuitry uses it to replace failing rows in the first array with non-failing rows from the second array. Replacement is accomplished by redirecting the input/output (I/O) lines from a failing row to the corresponding replacement row, based on the mapping in the repair table. The repaired memory is retested as a single addressable array. During the retest, failing rows in the second array are ignored. If failing rows are detected in the repaired first array during the retest, a "fail" result is returned; otherwise, a "pass" result is returned. The first array may represent the accessible portion of the memory and the second array the redundant portion. In an embodiment of the system disclosed herein, testing of the memory is done during the first stage of a two-pass procedure, and retesting during the second stage. The operation of the self-test and self-repair systems is directed by some hardware embodiment of a finite state machine (FSM), e.g., a programmable logic array. Memory tests performed by the BIST may consist of writing a bit pattern to a portion of the memory, then reading back the contents and comparing them to the original bit pattern. A commonly used bit pattern, called a checkerboard, consists of alternating 1's and 0's.

In addition to faulty row replacement, the repair table is used to assign addresses generated by the BIST that exceed the dimensions of the first array (i.e., >m) to rows in the second array. When the BIST asserts these "out-of-range" addresses, the repair circuitry redirects the I/O lines to the associated redundant rows; this enables the BIST to test the redundant portion of memory, which it cannot directly access.

A BISR Wrapper method for combining self-test and self-repair of a semiconductor memory is also contemplated herein. According to this method, a memory consisting of first and second arrays is tested as a single contiguous array, and the addresses of failing rows recorded. Using the results of this test, a repair table is then created. Each entry of the repair table is associated with a non-failing row from the second array and contains the address of one of the failing rows. Upon completion of the repair table, the entire memory is retested, this time ignoring failing rows in the second array. During retesting and in actual use, each failing row from the first array whose address is contained in one of the table entries is replaced by the non-failing row from the second array associated with that entry. Replacement of a first row by a second row consists of redirecting the I/O lines to the second row. At the conclusion of the retest, the Wrapper method returns a final result of "fail" if a row from the first array fails, and a final result of "pass" otherwise. The method also discloses using the repair table to map row addresses extending beyond the address range of the first array to rows in the second array, and using the repair circuitry to automatically redirect I/O lines to those rows upon detection of the out-of-range addresses. This allows the second array to appear as a contiguous extension of the first array during testing.

In addition to the above-mentioned BISR Wrapper system and method, a computer-usable carrier medium having program instructions executable to implement the above-described BISR Wrapper method is also contemplated herein. The carrier medium may be a storage medium, such as a magnetic or optical disk, a magnetic tape, or a memory. In addition, the carrier medium may be a wire, cable, or wireless medium along which the program instructions are transmitted, or a signal carrying the program instructions along such a wire, cable or wireless medium. In an embodiment, the carrier medium may contain program instructions in a hardware description language, such as Verilog, to configure circuitry within the memory device capable of implementing the FSM, and self-test/self-repair logic.

BRIEF DESCRIPTION OF THE DRAWINGS

Other objects and advantages of the invention will become apparent upon reading the following detailed description and upon reference to the accompanying drawings in which.

Figure 1A:
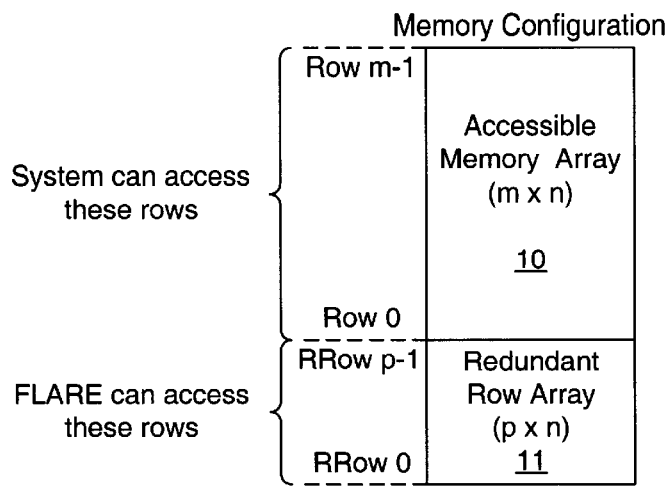
FIGS. 1a and 1b illustrate the organization of an exemplary memory device capable of self-repair, and the control signals used to access the memory.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1B:
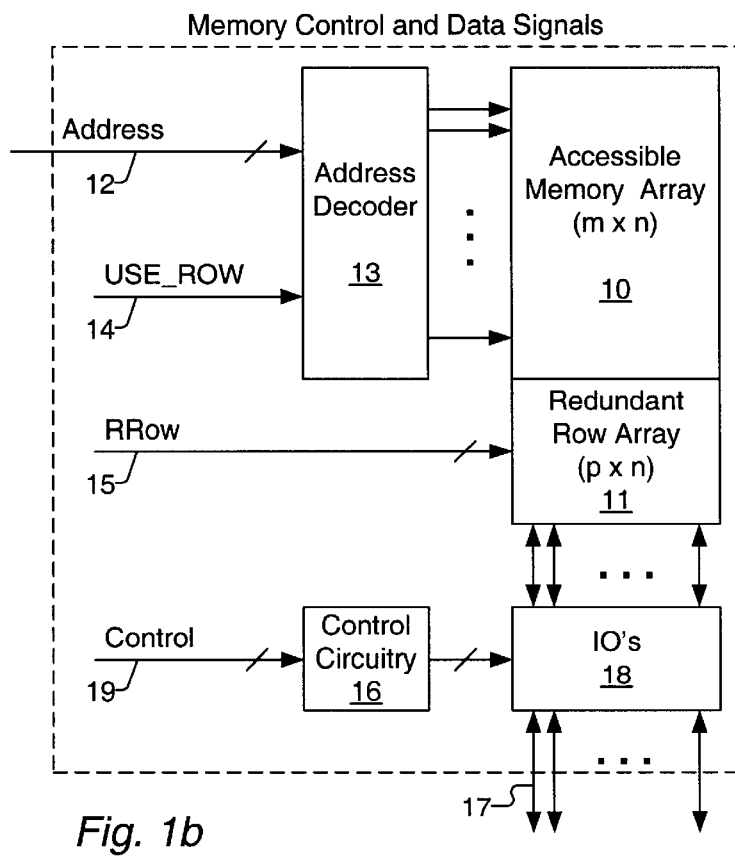

A typical memory device, as considered herein and shown in FIGS. 1a and 1b, may be organized as m×n cells of accessible (i.e., addressable) memory 10 and p×n cells of redundant memory 11. The use of redundant memory locations, together with on-chip circuitry for testing memory cells and remapping memory addresses, permits built-in self-test (BIST) and built-in self-repair (BISR) of memory devices. In the accessible memory 10, addresses are decoded and activate specific rows. The system may access only those addresses for writing and reading the data from memory. In the Built-in Self Repair (BISR) memory shown in FIG. 1, which not only has system accessible address rows arrays, but also redundant row arrays, the redundant row arrays share the data bit-line with accessible memory arrays. The memory USEROW input 14 is used to share the data bitline between accessible memory arrays and redundant row arrays; USEROW=1 selects the redundant rows, and USEROW=0 selects the accessible rows. Each redundant row has individual RROW inputs to activate specific redundant rows. The redundant rows, RRow 0–RRow p-1, are depicted in FIG. 1a as being contiguous with the accessible rows, Row 0–Row m-1, with RRow p-1 adjacent to Row 0. However, it should be understood that the configuration shown is merely exemplary, and other arrangements are consistent with the method contemplated herein. FIG. 1b shows the various control signals used to address the memory array. The Address control signals 12 for the accessible rows are attached to pins on the device package, as are the Data I/O signals 17. Address control signals 12 interface to the memory array through Address Decoder 13. The internally accessible bus 15 accesses the redundant rows. Hence, rows Row 0–Row m-1 are externally accessible (along with data input/output bus 18), while rows RRow 0–RRow p-1 are not. Internally accessible control circuitry 16 connects the I/O lines 17 to either the accessible 10 or the redundant 11 rows. The control circuitry 16 receives control signals 19, which include write enable (WE), clock (CLK), device enable (EN) signals. USE_ROW line 14 selects either the externally accessible Address control lines 12 or the internal RRow lines 15 as the source of the current memory address. The ability to switch address and control lines between the accessible and redundant portions of the memory device is required for self-test and self-repair.

A common memory test consists of writing a "checkerboard" pattern to all the memory locations and then reading it back. This test consists of placing alternating 1's and 0's in all the locations, and then verifying that the written values were actually stored in those locations. If a particular cell is defective it will appear as a discrepancy in the checkerboard pattern when it is read back. A cell that cannot be written to will in effect be "stuck" at either a 1 or 0. An attempt to write the opposite value to that cell will fail, and will show up as an anomaly in the checkerboard upon reading back the memory. As an example, assume that the memory location in column 3 of row 1 is defective (indicated by crosshatched pattern) and is stuck at logic level 0. The checkerboard bit pattern shown in FIG. 1a attempts to write a logic level 1 to the faulty cell, but when the memory is read back the resulting pattern is as shown in FIG. 1b. The anomalous occurrence of a 0 in column 3 of row 1 indicates that the written value was not stored, betraying the bad memory cell. Note that two complementary checkerboard patterns are required for a complete test, since this ensures that each cell is tested with both a 1 and a 0.

The checkerboard pattern can also be used to detect interaction between adjacent rows. In such cases, certain cells tend to follow the logic transitions of neighboring cells. As an example, assume the memory cell in column 3 of row 1 is initially at logic state 0, but that it interacts with an adjacent cell (e.g., column 3 of row 2). When the neighboring cell in row 2 is set to logic state 1, the interacting cell changes along with it. As noted in the previous example, the checkerboard pattern writes alternating logic states to adjacent cells. When the memory is read back, the error induced by interaction with the adjacent row is revealed as an anomalous bit pattern in the checkerboard pattern.

Some currently existing BIST/BISR routines consist of a two-stage procedure in which self-test and self-repair functions are performed concurrently. In the first of two BIST runs, the addressable memory is tested row-by-row and defective accessible memory rows are replaced with redundant memory rows on an as-needed basis. A comprehensive test of the addressable memory is then performed in the second BIST run. As described earlier, such methods may be prone to overlook certain types of memory errors, with the possible result that defective devices are certified as good, or good devices flagged as bad.

To obtain more rigorous and complete test coverage of the memory device, a three-stage BIST/BISR method may be used to test the entire redundant and accessible portions of the memory device before implementing self-repair. In the first BIST run, a checkerboard pattern is used to test the redundant memory, along with the adjacent row of accessible memory. A similar test is performed on the accessible memory in a second BIST run. Self-repair is then attempted, using known-good redundant rows to replace faulty accessible rows. A third BIST run performs a verification test on the repaired accessible memory. If any errors are detected during the third BIST run, the memory is failed; otherwise, it is certified as good.

BIST routines are typically embodied as a state machine, often referred to as a BIST engine. The state machine may be created using some form of silicon compiler and implemented using circuitry internal to the memory device. However, the majority of the available silicon in the memory device is allocated to the memory array itself, limiting the complexity of the BIST. Consequently, a BIST engine is generally designed to operate with a fixed array size. Thus, a separate BIST is needed for each array size that is encountered in the complete BIST/BISR sequence.

Figure 2:
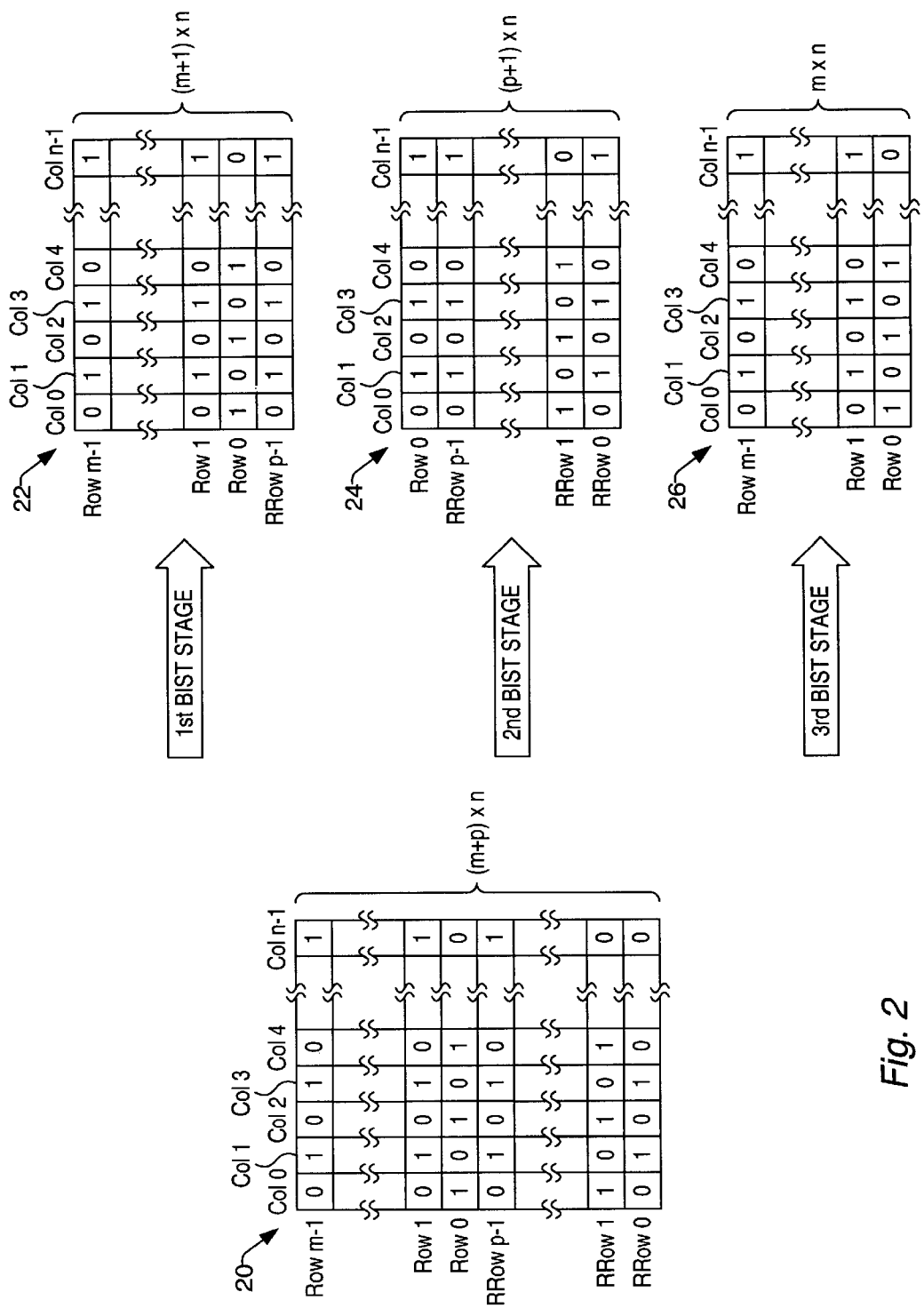
FIG. 2 depicts testing of a memory device, using a three-stage BIST.

For example, the three-stage BIST/BISR method discussed above requires three different array sizes to be handled by the BIST and BISR circuitry. As shown in FIG. 2, the complete memory array 20 is comprised of redundant rows RRow 0–RRow p-1, and accessible rows Row 0–Row m-1. The first BIST stage 22 tests the (m+1)×n array consisting of the m accessible rows, together with the adjacent redundant row RRow p-1. Similarly, the second stage 24 tests the (p+1)×n array consisting of the p redundant rows, together with the adjacent accessible row Row 0. Finally, the third stage tests the m×n array consisting of the m rows of the (repaired) accessible memory. As discussed in detail below, not only does each array size require a dedicated BIST, but the associated BISR circuitry must often be modified whenever the respective BIST changes. BIST methods employing more than two stages would therefore require additional dedicated BIST circuitry.

Figure 3:
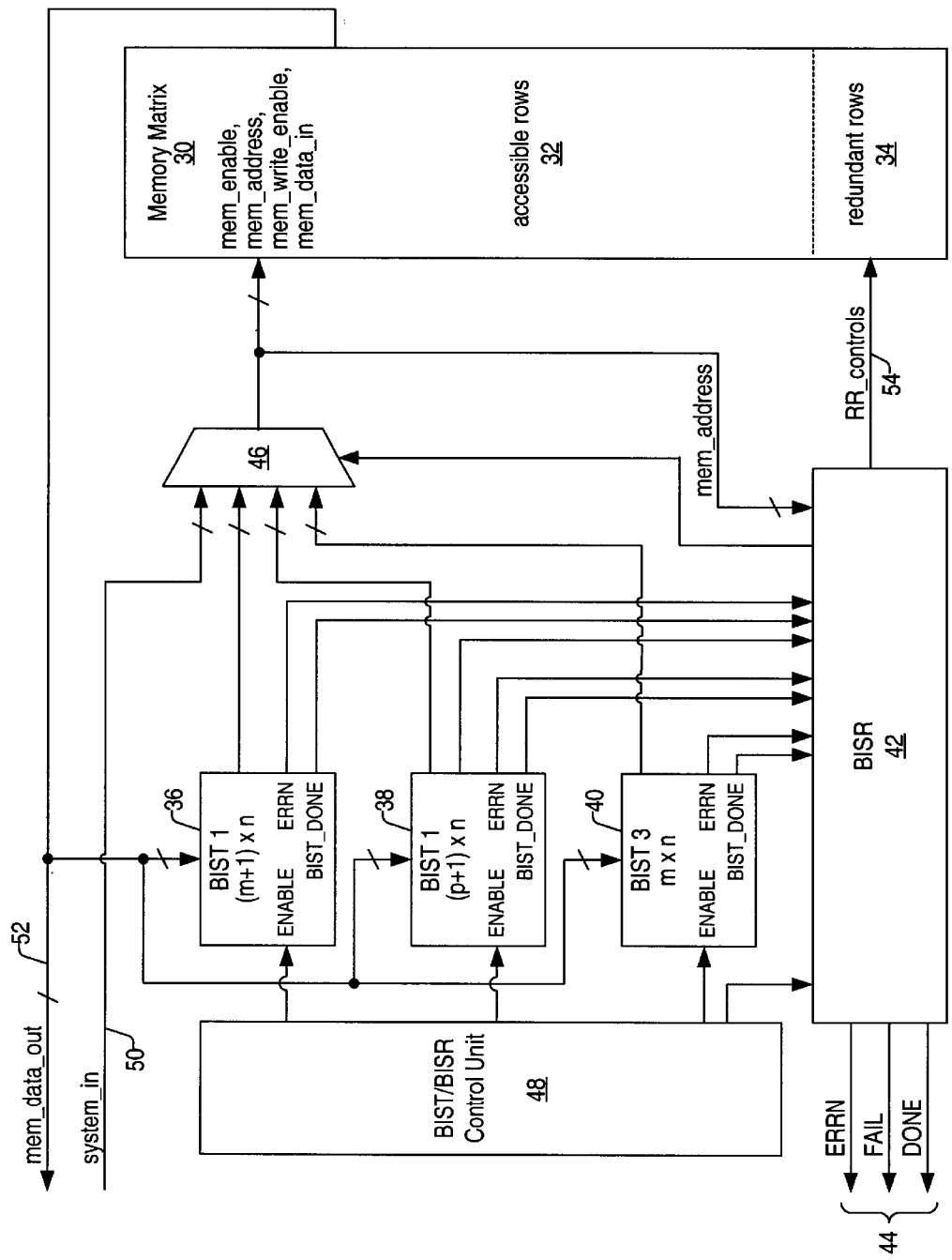
FIG. 3 shows self-test and self-repair circuitry corresponding to a three-stage BIST.

FIG. 3 is a block diagram illustrating a typical interface between a three-stage BIST/BISR system and a memory device such as the one shown in FIG. 1. The figure represents circuitry within the memory device, with externally accessible signals shown entering and exiting the device at the far left. In this figure, the memory matrix 30 is comprised of both accessible 32 and redundant 34 rows. BIST engines 36, 38, and 40, shown in FIG. 3 are each configured to access a different-sized portion of the entire memory matrix 30. In this case, BIST 1 36 may make a first-stage test of the accessible memory 32 together with an adjacent redundant row (m+1 rows), while BIST 2 38 performs a second-stage test of the redundant memory 34 together with an adjacent accessible row (p+1 rows). BIST 3 40 verifies the repaired accessible memory 32 (m rows). Various memory control signals, such as memory address, write enable, etc., are shared between the BISTs and the outside world via multiplexer 46. During normal operation, these control signals are furnished by external circuitry, but during self-test the signals are generated by the BISTs. BISR 42 switches multiplexer 46, and also mediates access to the redundant memory. Each BIST receives an ENABLE signal from the BIST/BISR Control Unit 48, and generates an error flag when a defect is detected (ERRN) and a flag indicating that the test stage is complete (BIST_DONE). Since BISTs 36, 38 and 40 each test different portions of the memory, their flags are combined by the BISR 42. The BISR uses the flags, together with the current memory address, to perform self-repair of the accessible memory. Overall status and results are presented by the BISR 42 as externally accessible signals ERRN, FAIL and DONE flags 44. Operation of the three BISTs and the BISR is coordinated by the BIST/BISR Control Unit 48.

The data input (system_in bus 50) and output (mem_data_out bus 52) normally constitute an "I/O path" for the accessible memory array. That is, data are written to a row of accessible memory via system_in 50 and read from the accessible row via mem_data_out 52. However, the BISR is able to reroute the I/O path to a redundant row, using RR_controls bus 54. When a defect in the accessible memory is discovered during self-test, the BISR places the defective row address in a lookup table (referred to herein as a "repair table"). Associated with each defective row address in the repair table is a redundant row. To repair the memory, the BISR reassigns the address of each defective row to one of the available redundant rows using the repair table. In effect, the BISR substitutes a good row for a bad one. When the repaired memory device is in use, the BISR performs this substitution dynamically. Each time the memory is accessed, the BISR compares the current address with the defective row addresses in its repair table; in the event of a match, the BISR automatically substitutes the corresponding redundant row into the I/O path. Clearly, there is some overhead associated with these additional operations. However, the BISR circuitry is typically fast enough not to significantly degrade the operating speed of the memory device. At the end of the third BIST stage, when the test is concluded, BISR 42 sets the DONE and (depending on the test outcome) FAIL indicators 44.

A checkerboard pattern may be used to test for adjacent row interaction in the first BIST run. This pattern must comprise all the accessible rows, together with the redundant row adjacent to the accessible memory. BISTs 36, 38 and 40, typically cannot directly access the redundant rows 34. Therefore, BISR 42 must address the adjacent redundant row (using redundant row control signals 54), while the BIST generates the bit pattern for the row. Along with the memory address, the BISR monitors the error indicator ERRN for each of the BISTs. Depending on which BIST is active, the BISR may or may not substitute redundant rows for the memory address at the time of the error. Such coordinated interaction between the BIST and BISR requires logic circuitry common to both. Therefore, if the BIST is modified, corresponding changes must often be made to the BISR. This is a drawback, since the test algorithms that are the basis for the BIST state machines are frequently subject to change. Therefore, while it is desirable to incorporate improved test procedures in the BIST, the associated (possibly extensive) changes to the BISR present an obstacle.

The method disclosed herein removes any dependence of the BISR on the specific implementation of the BIST by employing a "Wrapper" system, which integrates the BIST and BISR functions so that the BISR uses only the BIST_DONE and BIST_ERRN status flags of the BIST. Conceptually, the BISR wrapper is a combination of built-in self test and repair logic that should be compatible with any memory BIST engine. Changes in the BIST mechanism or algorithm do not affect the BISR algorithm. Thus, the BISR wrapper logic is substantially independent of the BIST. To be compatible with the BISR wrapper design, the BIST unit needs only BIST_DONE and BIST_ERRN outputs and a BIST_ENABLE input. This generic interface renders the BISR a virtual "black box". Operational details, such as the number and type of tests carried out by the BIST, therefore become irrelevant to the BISR. Consequently, modifications to the BIST (e.g., improvements to the test algorithm) can be introduced without affecting the BISR circuitry. Furthermore, according to the method disclosed herein, a single fixed-size BIST is used for the entire BIST/BISR procedure. The single BIST is designed to address an array that is larger than the accessible memory. For example, if the memory device is organized as an m×n accessible memory array, together with a p×n redundant memory array, the BIST will be configured to address a single (m+p)×n array. Row addresses beyond the accessible memory (>m) are herein referred to as "out-of-range" addresses. Self-test and self-repair may be accomplished in a two-pass procedure, in which the same array size is used in both passes. This is preferable to a multi-BIST system, since it requires less complex circuitry and uses less of the available die area in the memory device.

Figure 4:
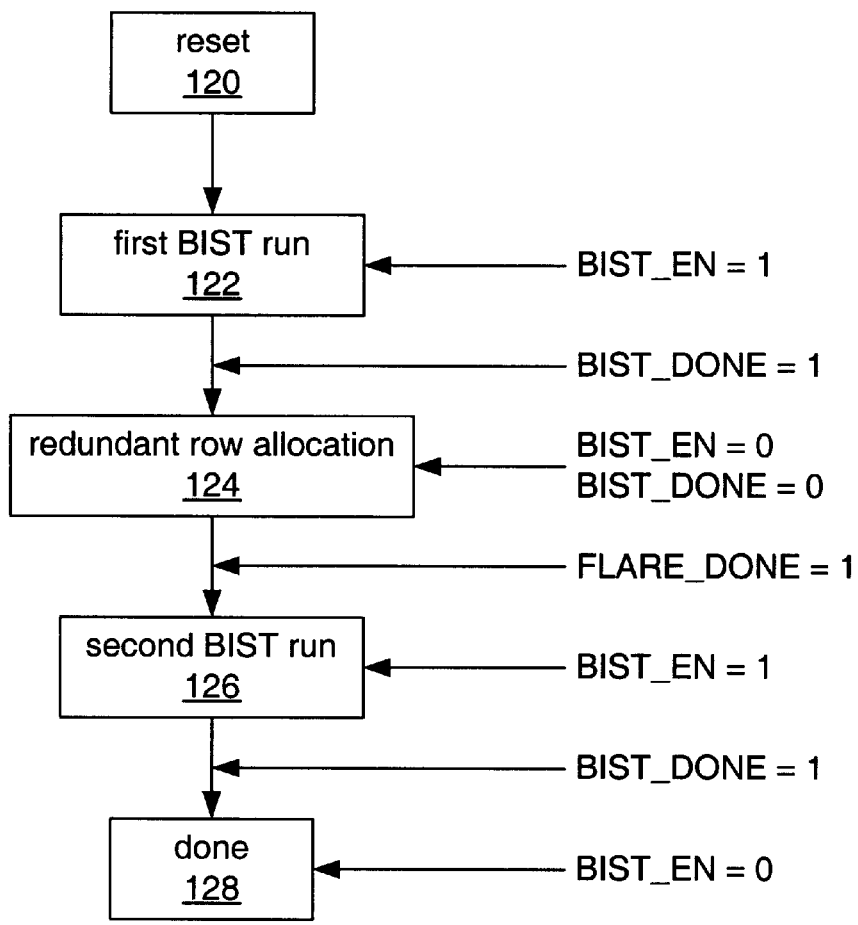
FIG. 4 shows the activity of status signals between a generic BIST engine and the BISR Wrapper throughout the self-test/self-repair sequence.

FIG. 4 shows how the BIST status flags change throughout the self-test/self-repair process. The process begins with a reset 120 of the self-test/self-repair logic. During the first BIST run 122, BIST_EN=1, indicating that the built-in self-test logic is active during the comprehensive test of the memory. Upon completion of the first BIST run, the BIST_DONE flag goes high. While the redundant row allocation process takes place 124, BIST_EN=0 and the BIST_DONE flag is reset. When the redundant row allocation process finishes, the FLARE_DONE flag is raised, triggering the start of the second BIST run 126. While the BIST tests the repaired memory, the BIST_EN signal is high again, until the test is completed 128.

Figure 5:
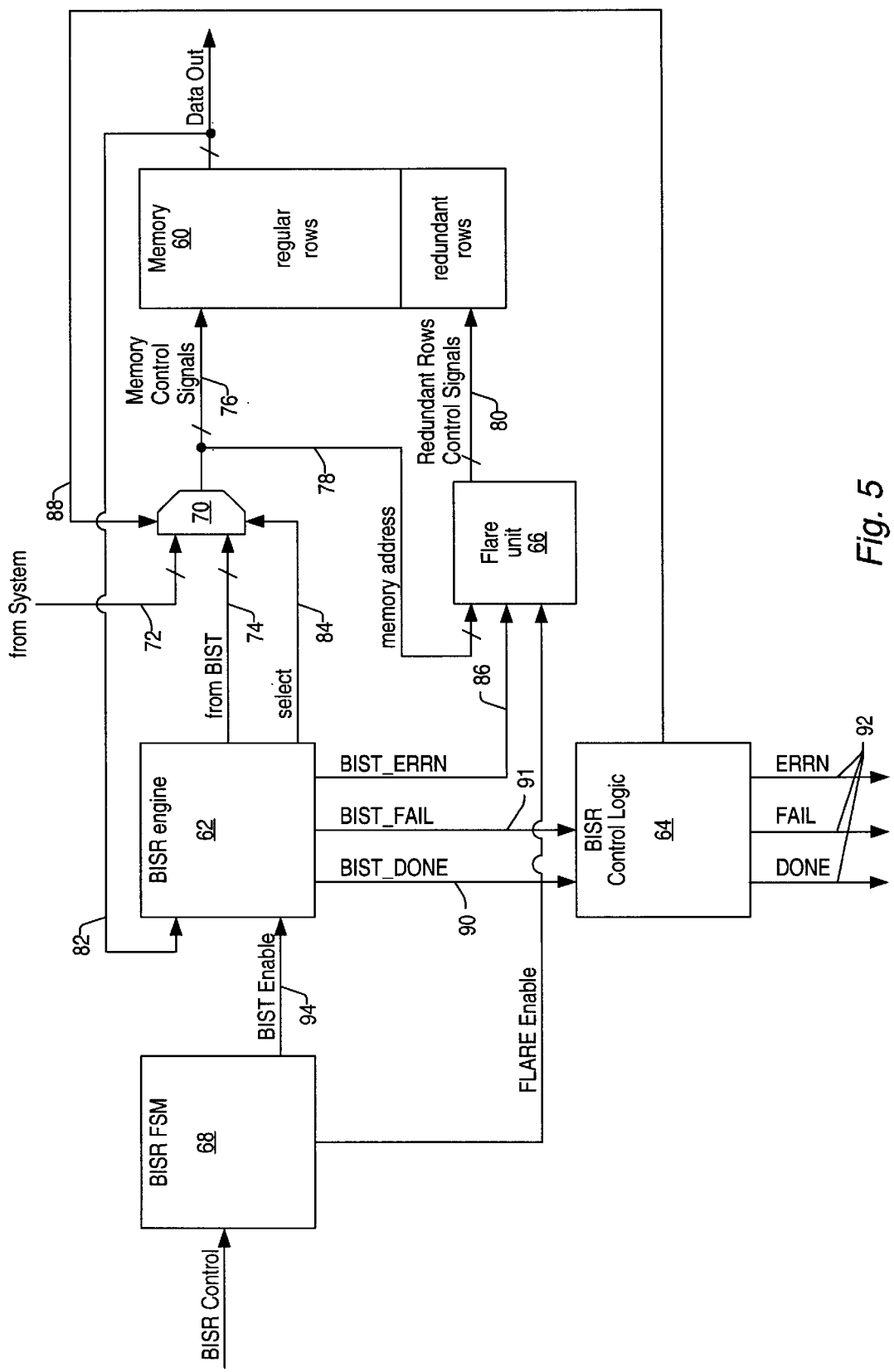
FIG. 5 shows the circuitry associated with an embodiment of the method and system disclosed herein.

FIG. 5 is a block diagram of an embodiment of a system based on the BISR Wrapper method disclosed herein. This BISR wrapper design includes three units: the BIST unit (engine) 62, the BISR FSM control logic unit (BISR finite state machine 68, together with BISR control logic unit 64) and the FLARE (Fault Location Address, Repair Allocation) unit 66. The BISR FSM control logic unit handles the input and output signals of the BIST, such as BIST__ENABLE 94, BIST__ERRN 86, BIST__DONE 90 and BIST__FAIL 91, and generates three output signals: ERRN, DONE and FAIL 92. This system tests an (m+p)×n memory array 60, comprised of m accessible and p redundant rows.

As mentioned above, the BIST is configured to test the entire memory array—both the accessible and the redundant portions. Therefore, the BIST generates row addresses from 0 to m+p−1. Addresses from 0 to m−1 correspond to the accessible rows, which are directly accessible by the BIST, while addresses from m to m+p−1 correspond to the redundant rows, which are not normally accessible to the BIST.

Figure 6A:
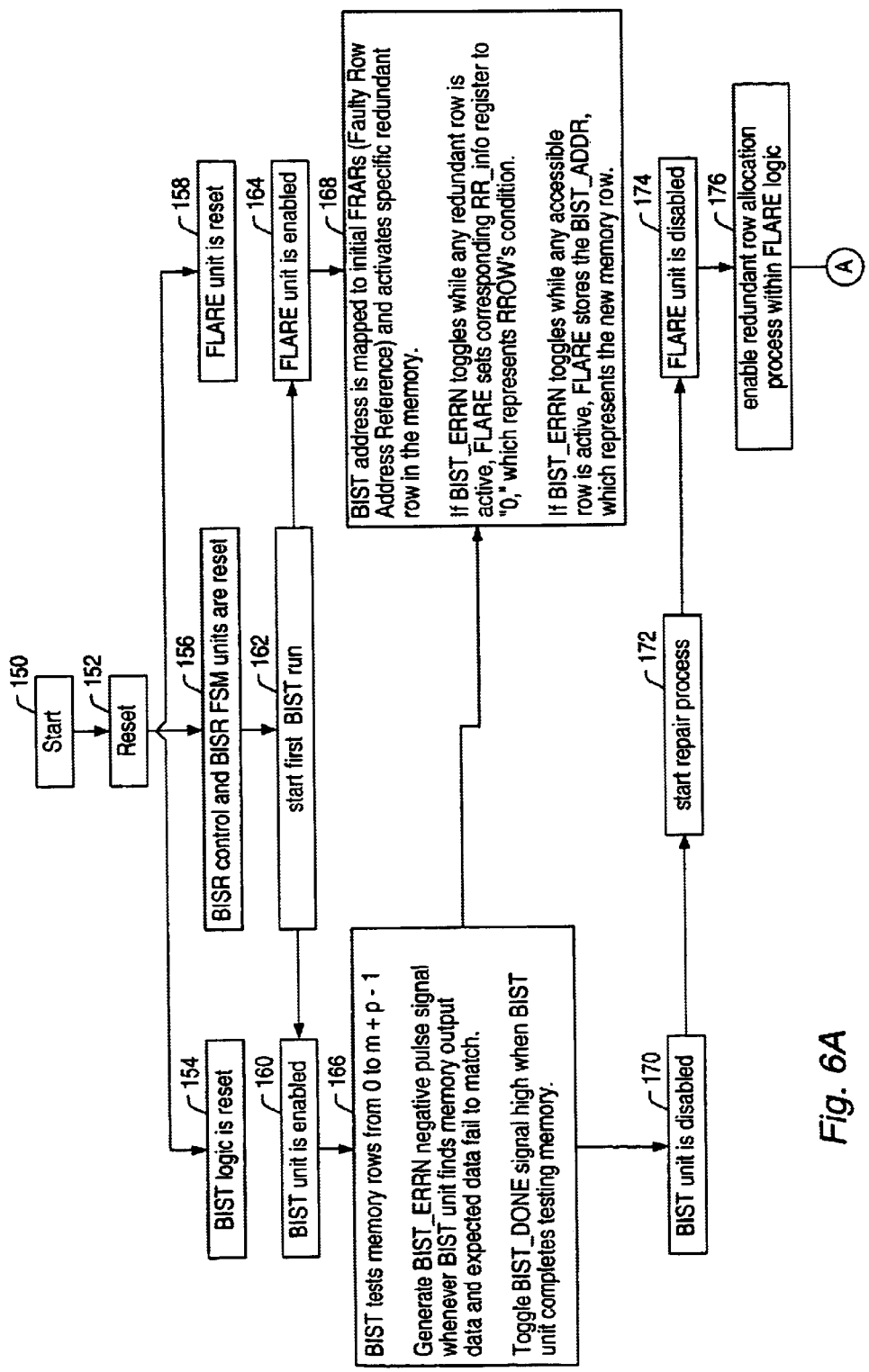
FIGS. 6A–6B are a top-level flowchart, illustrating the sequence of operations in an embodiment of the BISR Wrapper method disclosed herein.
Figure 6B:
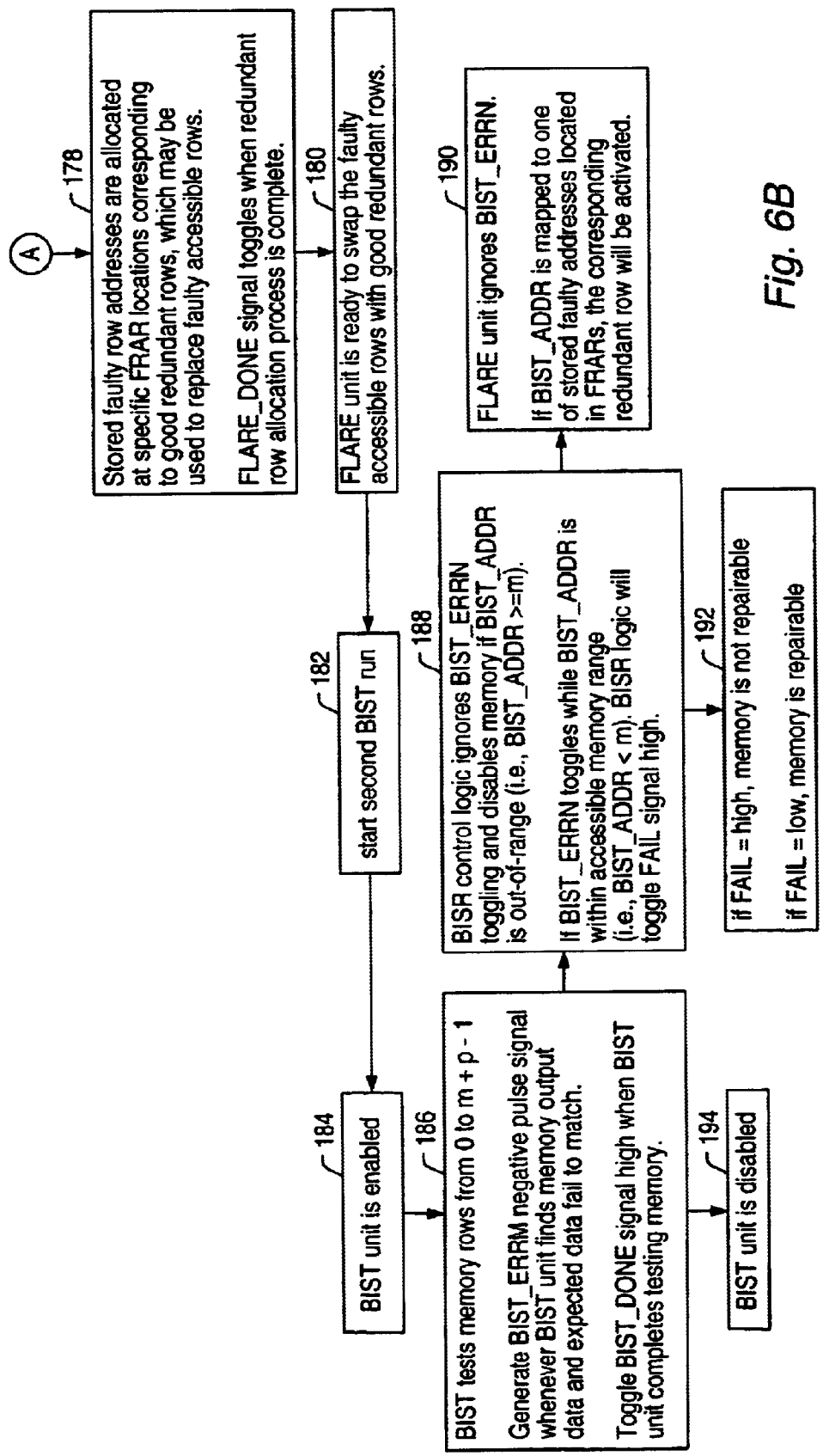

FIGS. 6A–B contain a flowchart of the operation of the FSM control logic unit, which is a combination of the BISR finite state machine and BISR control logic (items 68 and 64 in FIG. 5). At the start of its operation 150, a reset signal 152 is required for initializing the BISR wrapper system. After being reset 156, the BISR FSM control logic unit functions as the central control unit of the BISR wrapper system. When the BISR FSM logic unit is reset, then activated, it disables (154 and 158), then enables (160 and 164) the BIST and FLARE units for the first BIST-run to test the memory. Once the first BIST-run begins 166, BISR__FSM logic unit waits for the BIST__DONE signal generated from the BIST unit. When BIST__DONE toggles, the BISR__FSM logic unit disables the BIST 170 and FLARE units 174, and enables the redundant row allocation (i.e., repair) process 176. While redundant row allocation is performed 178, the FSM waits for the FLARE__DONE signal generated from the FLARE unit. The FLARE__DONE signal toggles when the Repair Allocation Process is finished in the FLARE unit, and the substitution of good redundant rows for faulty accessible rows is complete 180. FLARE__DONE triggers the BISR__FSM control logic unit to start the second BIST-test 182 (of the repaired memory) by enabling the BIST unit 184. During the second BIST-run 186, the FSM waits for the BIST__DONE signal, while the BIST unit tests the entire memory. The BISR Control Logic (part of the BISR FSM control logic unit) monitors 188 the BIST__ERRN signal from the BIST. The objective of the $2^{nd}$ BIST stage is to confirm the absence of defects in the accessible memory. Consequently, faults occurring at out-of-range addresses (i.e., BIST__ADDR≧m) are of no interest, so the BISR FSM control logic unit ignores the BIST__ERRN signal and disables the memory for addresses in this range. On the other hand, if the BIST__ERRN signal toggles while BIST__ADDR is within the accessible memory range, the BISR FSM control logic unit raises the FAIL signal, signifying that the memory is not repairable. Note that this will happen only if there are not enough good redundant rows in the memory array to replace all of the defective accessible rows. During the redundant row allocation process 178, a repair table was created that associates faulty accessible rows with usable redundant rows. During the second BIST run, this table is used by the FLARE unit logic 190 to substitute the usable redundant rows for the faulty accessible rows. (The logic for making this substitution is discussed in greater detail below.) When the second BIST run finishes, the BIST unit toggles BIST__DONE, which triggers the BISR FSM control logic to disable the BIST unit 194 and raise the DONE signal, completing the self-test/self-repair process. If the FAIL flag is active at the end of the process 192, the memory is defective; otherwise, the memory is deemed good.

The following registers and counters are used in an embodiment of the BISR Wrapper method described herein:

FRAC (Faulty Row Address Counter) is a counter used to record the number of faulty rows detected in the first of two BIST passes through the memory array.

FRAR (Faulty Row Address Reference) is a p-element array used by the

FLARE unit to associate each redundant row with a specific row address $R_{addr}$. Initially, the row addresses are simply the out-of-range addresses (i.e., $m \leq R_{addr} \leq m+p-1$). As explained in detail below, this permits the BIST unit to test the redundant rows in the first BIST run. Following the redundant row allocation operation, the FRAR contains the addresses of faulty accessible rows detected during the first BIST run, so that usable redundant rows may be substituted for them in the second BIST run.

FRAS (Faulty Row Address Storage) is a p-element array, each element of which is the address of a faulty accessible row. The Faulty Row Address Counter (FRAC) serves as an index into this array. For example, if Row 31 is the $5^{th}$ of 5 faulty accessible rows, then $$FRAC=5,$$

and $$FRAS[FRAC-1]=31$$

RR__info (Redundant Row Information) is a flag register p bits long (one bit for each redundant row). Each bit indicates whether the corresponding redundant row is usable or not. For example, if RR__info[3]=1, then RRow 3 is usable; otherwise, RRow 3 is faulty.

RR__enable (Redundant Row Enable) is a flag register p bits long. Each bit is used to enable (or disable) a corresponding redundant row, so it can be substituted for a faulty accessible row. As described in more detail below, the redundant rows are enabled/disabled using combinatorial logic in the FLARE unit.

Figure 7:
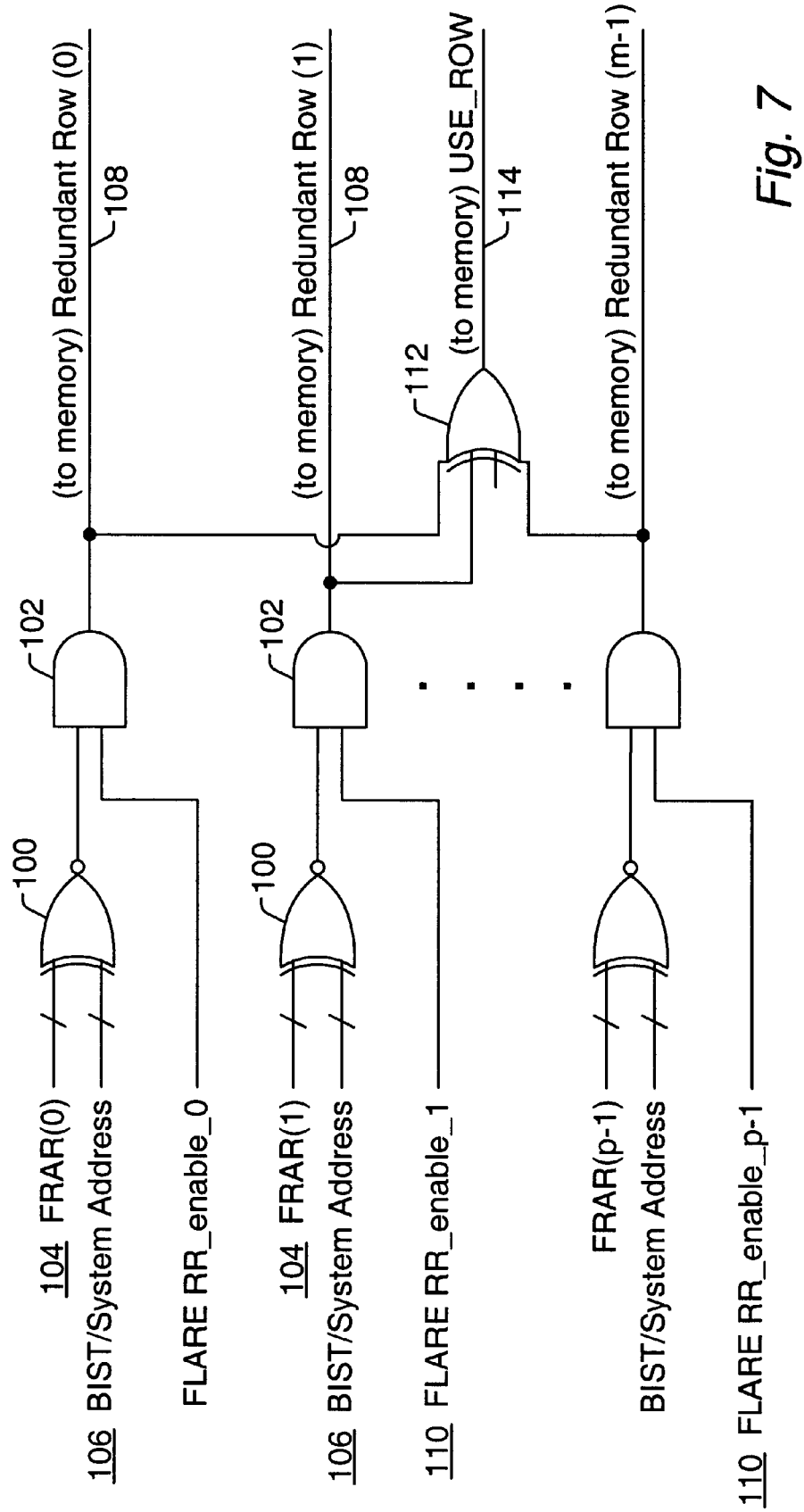
FIG. 7 shows an embodiment of circuitry used for redundant row replacement, according to the system and method disclosed herein.

FIG. 7 illustrates an embodiment of circuitry used by the FLARE unit to allow the BIST to access the redundant rows portion of the memory array. This circuitry switches in redundant rows when the BIST generates out-of-range addresses (m, . . . , m+p−1) during the first BIST run. It is also used to substitute good redundant rows for faulty accessible rows during the second BIST run. Recall that FRAR is an array containing p row addresses. This array associates each of the redundant rows with a row in the memory array. For example, the assignment FRAR[p−6]=m−3 associates RRow p−6 with Row m−3. Exclusive NOR gates 100 compare the row addresses 104 contained in the FRAR array with the current row addresses 106 generated by the BIST. A match results in the corresponding XNOR gate raising one input of the associated AND gate 102 to a HIGH logic level. The XNOR gate outputs are gated by AND gates 102, dependent on redundant row enable signals 110. (The redundant row enable signals are controlled by the corresponding bits in the RR__enable register, described above.) If the FLARE unit has enabled the particular redundant row 110, the AND gate 102 activates the corresponding memory address line 108. The USE__ROW line 114 driven by OR gate 112 routes the Data I/O bus to either the accessible (USE__ROW=0) or redundant (USE__ROW=1) portion of the memory array. Whenever any of the redundant row address lines is taken HIGH, OR gate 112 raises the USE__ROW line 114, placing the corresponding redundant row into the I/O path.

During the first of the two BIST runs, Faulty Row Address Reference array FRAR[0:p−1] is initialized with the p out-of-range addresses:

FRAR[i]=m+i (0≦i<p)

Thus, when the BIST generates an out-of-range address m+i, it is automatically mapped to the $i^{th}$ redundant row. During the first BIST run, as the memory is tested, the addresses of faulty accessible rows are recorded. At the end of the first BIST run, these faulty row addresses are loaded into FRAR[0:p−1] by the redundant row allocation process (discussed in more detail below), thus associating each faulty accessible row with one of the redundant rows. When the accessible memory is retested in the second BIST run, each time the BIST asserts the address of a previously detected faulty row, the circuitry of FIG. 7 substitutes the associated redundant row. This substitution of usable redundant rows for faulty accessible rows, using the FRAR array and the circuitry of FIG. 7, achieves repair of the memory array.

Figure 8A:
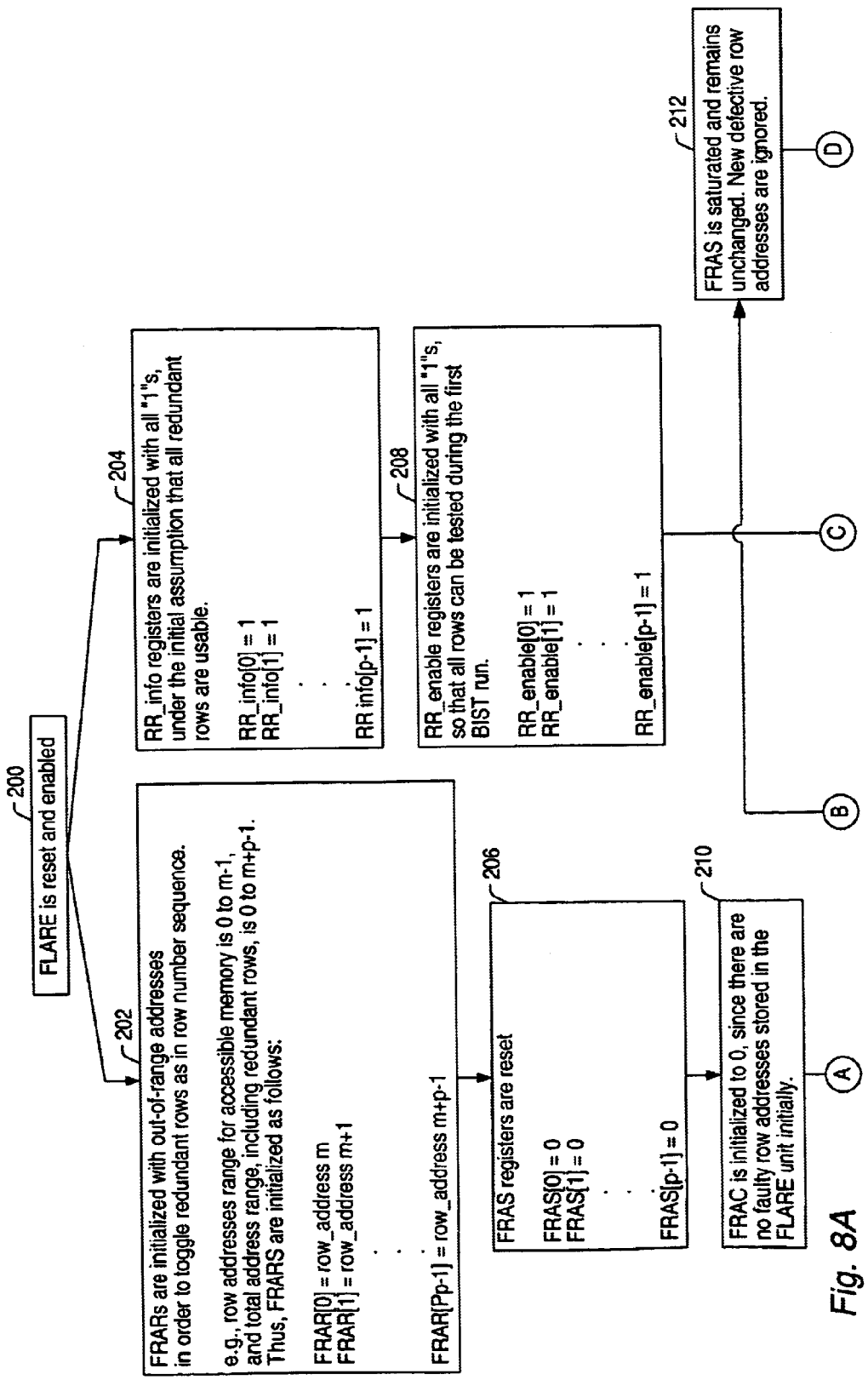
FIGS. 8A–B show a detailed flowchart of the Fault Locations Analysis and Repair Execution (FLARE) diagnostic procedure used in an embodiment of the BISR Wrapper method disclosed herein.
Figure 8B:
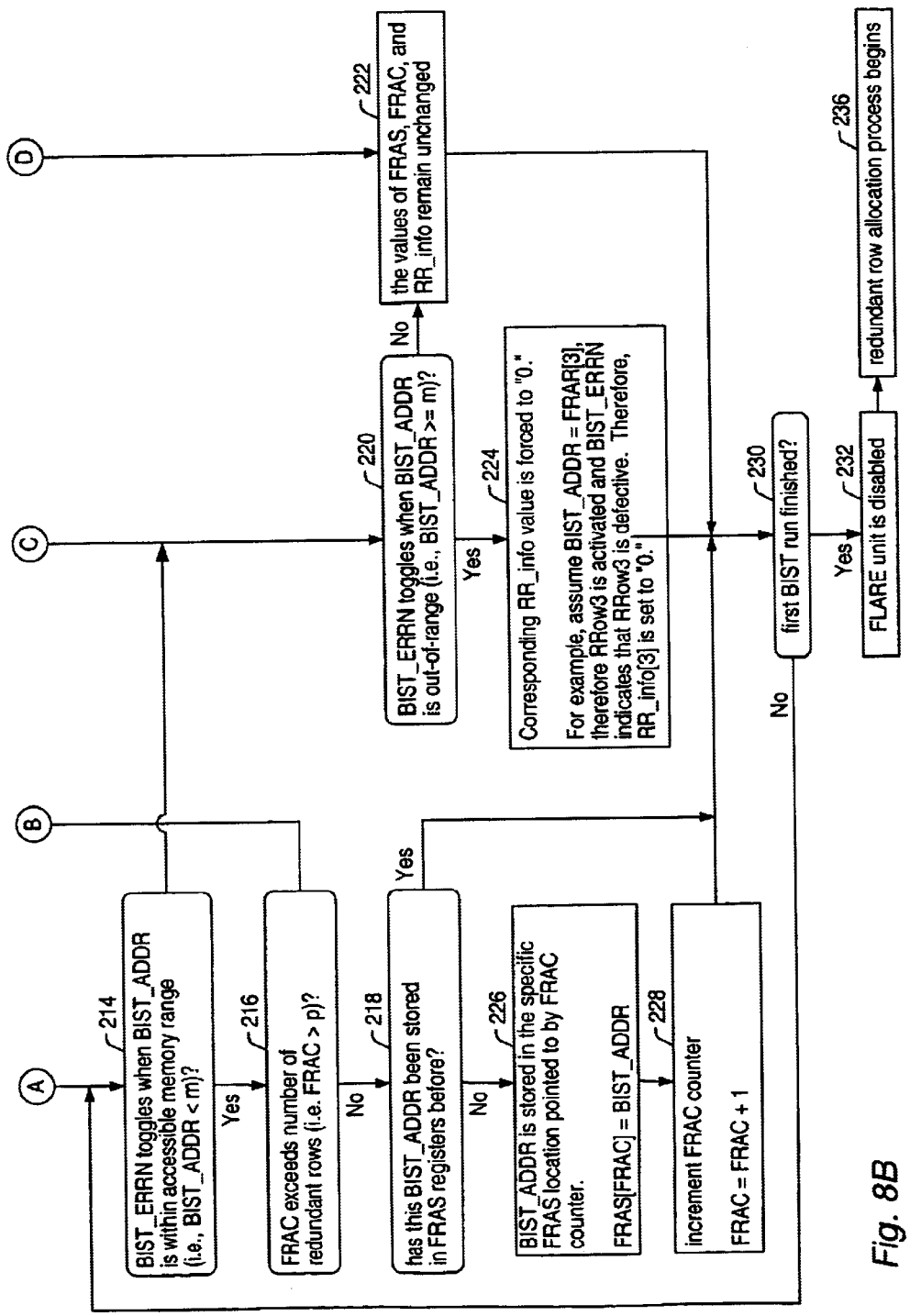
Figure 9:
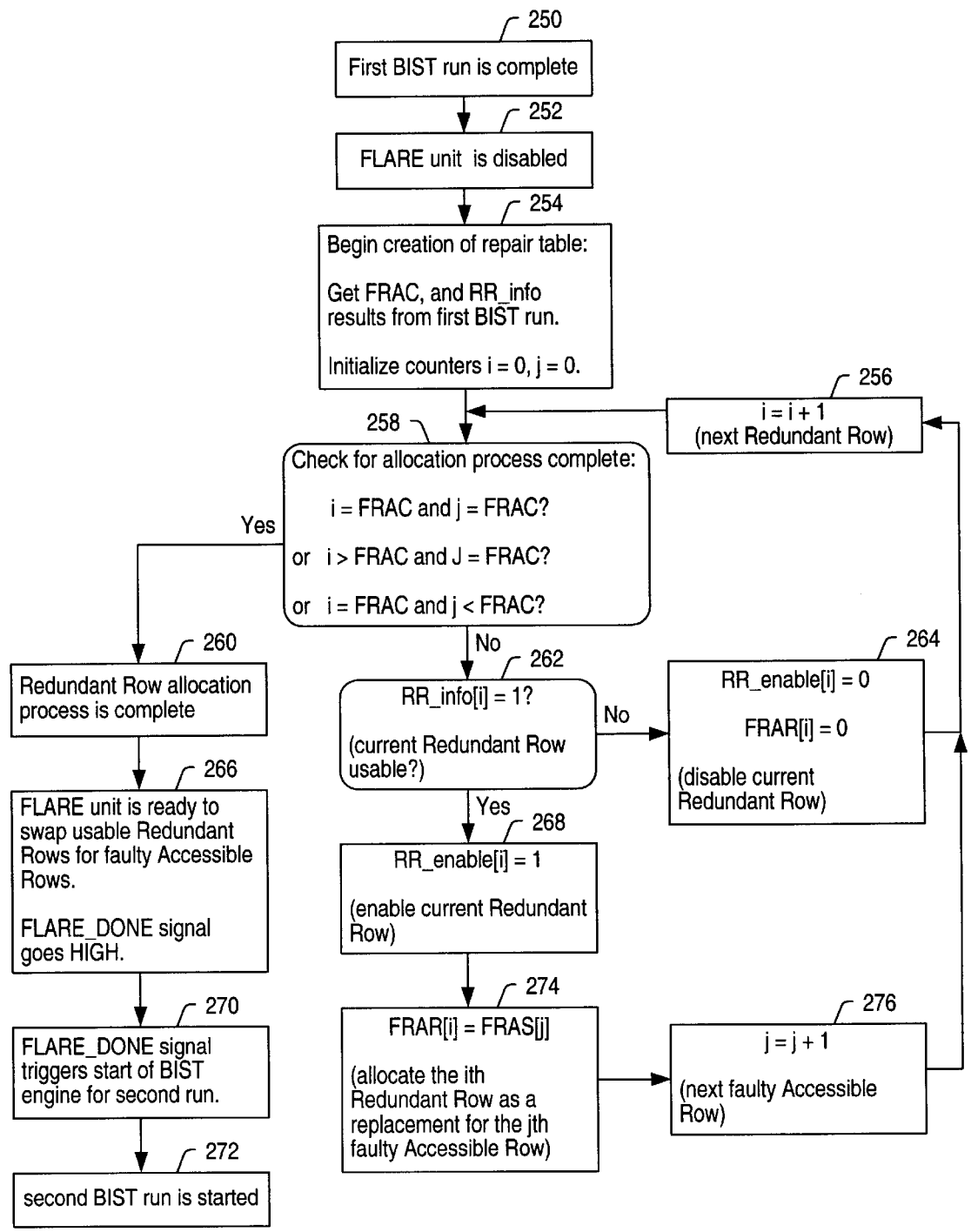
FIG. 9 shows a detailed flowchart of redundant row allocation (repair) procedure used in an embodiment of the BISR Wrapper disclosed herein.

A flowchart of FLARE unit diagnostics during the $1^{st}$ BIST stage appears in FIGS. 8A–B; this sequence of operations corresponds to item 166 of FIG. 7. The FLARE unit's registers are initialized with specific logic values 202 and 204. The BISR_FSM control logic asserts the BIST_ENABLE and FLARE_ENABLE signals to enable both BIST and FLARE units. The FRAR array is initialized 202 with the out-of-range addresses corresponding to the redundant rows:

FRAR[i]=m+i (0≦i<p)

As explained earlier, this initial assignment maps each out-of-range address m≦i<m+p generated by the BIST to the contents of some FRAR[i], and enables the BIST to access the associated redundant row RRow i. All p bits in the RR_info registers are set to 1 204:

RR_info=111, . . . ,11

As discussed above, each bit in the RR_info register corresponds to a redundant row; if a given bit is set to 1, the associated redundant row is usable (i.e., has no defects). The FRAS array (which stores the addresses of faulty accessible rows) is initialized 206:

FRAS[i]=0 for 023 i<p

The RR_enable register is initialized 208:

RR_enable=111, . . . ,11

Each bit in RR_enable corresponds to a redundant row; if a given bit is 1, the associated redundant row is enabled (i.e., may be swapped into the I/O path). At the start of the $1^{st}$ BIST stage, the assumption is that all the redundant rows are usable. Finally, the FRAC counter (which counts faulty accessible rows) is set to zero 210:

FRAC=0

The BIST unit starts generating memory control signals and data patterns to test memory by writing and reading back the same data. Not only the accessible memory arrays, but also redundant rows, are tested, since the BIST unit generates out-of-range values for BIST_ADDR (i.e., BIST_ADDR≧m). When the FLARE unit receives the out-of-range BIST_ADDR, it activates the corresponding redundant row (using the circuitry of FIG. 7). When the BIST unit finds defects in memory, it toggles the BIST_ERRN signal.

The BIST_ERRN signal appears at the ERRN output through the BISR FSM control logic unit. The FLARE unit detects BIST_ERRN signal and BIST_ADDR, and recognizes whether the defects detected are from accessible memory arrays or redundant row arrays 214. If a defect is found within the accessible memory range (i.e., BIST_ADDR<m), the current error count is checked to make sure it does not exceed the number of redundant rows (i.e., FRAC≧p) 216. Since the redundant rows are used for repair, if the number of defective accessible rows is greater than the number of redundant rows the memory cannot be repaired. If FRAC does not exceed the number of redundant rows, the current faulty row address is compared against the addresses contained in the faulty row address storage register 218 (FRAS), to determine if the current row has already been detected. If the current faulty row has already been flagged for repair, we check to see if any more rows remain to be tested 230. Otherwise, the faulty row address is entered into the FRAS register 226, at the location determined by the Faulty Row Address Counter (FRAC):

FRAS[FRAC]=BIST_ADDR

BIST_ADDR is then incremented 228, in preparation for testing the next row, and we check to see if the last row has been tested 230.

If BIST_ERRN toggles when the row address is out-of-range (i.e., BIST_ADDR≧m) 220, then a faulty redundant row has been encountered. A faulty redundant row cannot be used to replace a defective accessible row, and must be disabled. A redundant row is flagged as unusable by setting the corresponding flag in the RR_info register to 0 224. In the subsequent repair process, unusable redundant rows are physically disabled. If there are no more rows to be tested 230 the first BIST run is complete. Upon completion of the first BIST run, the FLARE unit is disabled 232 by the BISR FSM control logic, and the redundant row allocation process begins 236.

The redundant row allocation process associates the faulty row addresses stored in the FRAS registers to the specific FRAR locations corresponding to usable redundant rows found during the first BIST run. In other words, this process creates a repair table based on FRAS, FRAC, and the RR_info results. There are 4 possible results from the first BIST run:

(1) No defects were found in the accessible memory arrays.

(2) The number of defective accessible rows is less than number of non-defective redundant rows.

(3) The number of defective accessible rows is equal to number of non-defective redundant rows.

(4) The number of defective accessible rows is greater than the number of non-defective redundant rows.

Each of these cases will be examined in detail below:

In Case (1), all the accessible memory arrays are non-defective, so no Repair Allocation Process will take place during this stage. The FLARE unit generates a FLARE_DONE signal at the end of this stage.

In Case (2), the memory has ample non-defective redundant rows to replace the defective accessible rows. In this case, the FLARE needs to assign one of the addresses in the FRAR array to each individual FRAS register value (individual defective row address). As discussed above in connection with FIG. 7, this allows the FLARE unit to replace the defective row with a corresponding non-defective redundant row. Before doing this, the FLARE unit determines the location of non-defective redundant rows using the RR_info registers. Individual RR_info register logic values represent the status of corresponding the redundant row—i.e., if the RR_info register value is at logic 1, the corresponding redundant row is non-defective; otherwise, the corresponding redundant row is defective. This procedure is explained in the following example.

Assume, for example, the array of RR_info registers RR_info[0:3] represents four redundant rows. Further assume that RR_info[0]=1, RR_info[1]=0, RR_info[2]=1, and RR_info[3]=1 at the end of the first BIST run. Note that RR_info[1]=0 implies that redundant row 1 is faulty. Each location in array FRAS can store a faulty row address, and there were two different faulty addresses stored in the first two FRAS locations. Therefore, the FRAC value should be 2 at the end of the first BIST run. Initially, the FLARE unit checks whether the RR_info[0] flag is at logic 1 (indicating that this redundant row is not faulty, and can be used for replacement of a faulty accessible row), and if so, it sets flag bit RR_enable[0] to logic 1. Since, RR_info[0]=1, FRAR [0] is set to the faulty accessible row address contained in FRAS[0]. Next, the FLARE unit checks RR_info[1] (the second redundant row) which is set to logic value 0 (indicating that the redundant row is bad, and not available for use as a replacement). In this case, flag bit RR_enable[1] is set to logic 0 (disabling the redundant row), and FRAR[1] is also set to 0. Then FLARE unit checks the RR_info[2] flag bit. Since RR_info[2] is set to logic 1, the FLARE unit recognizes that redundant row 2 is non-defective, so it sets RR_enable[2] to logic 1 and FRAR[2] is set to the faulty accessible row address contained in FRAS[1]. At this point, since FRAC indicates that there are no more faulty addresses stored in FRAS locations, the FLARE unit sets FRAR[3] to 0 and RR_enable[3] to logic 0, to disable redundant row [3] from being activated accidentally, and then raises the FLARE_DONE signal. For this example, at the end of the repair process:

| | | |
|---|---|---|
| FRAR[0] = FRAS[0] | RR_info[0] = 1 | RR_enable[0] = 1 |
| FRAR[1] = 0 | RR_info[1] = 0 | RR_enable[1] = 0 |
| FRAR[2] = FRAS[1] | RR_info[2] = 1 | RR_enable[2] = 1 |
| FRAR[3] = 0 | RR_info[3] = 1 | RR_enable[3] = 0 |

Actually, the allocation process is finished when the RR_info[x] reaches 2 (i.e. x=2), which is same as the FRAC value (i.e., FRAC=x). This occurs when every faulty accessible row has been paired with a usable redundant row, at which point, the remaining redundant rows are not needed. The FLARE unit sets the unneeded FRAR and RR_enable registers to a default value of logic 0. The RR_enable signals are used in conjunction with the circuitry of FIG. 7; wherever FRAR[x] is valid, the corresponding RR_enable [x] register value has to be logic 1, so the faulty accessible row whose address is contained in FRAR[x] can be replaced by specific redundant row RRow x.

In Case (3), we assume there is a third defective accessible row. The address of the third faulty accessible row would then be contained in FRAS[2]. Following the procedure used for case (2) above, we arrive at the same result, except that his time FRAR[3] contains the third faulty row address (from FRAS[2]).

| | | |
|---|---|---|
| FRAR[0] = FRAS[0] | RR_info[0] = 1 | RR_enable[0] = 1 |
| FRAR[1] = 0 | RR_info[1] = 0 | RR_enable[1] = 0 |
| FRAR[2] = FRAS[1] | RR_info[2] = 1 | RR_enable[2] = 1 |
| FRAR[3] = FRAS[2] | RR_info[3] = 1 | RR_enable[3] = 1 |

Note that all three non-defective redundant rows have been used to repair the three faulty accessible rows.

For Case (4), we assume the RR_info values remain as above. This time however, we assume that four faulty accessible rows have been detected. Although all four FRAS registers now store different defective addresses, the FRAR values can only be set to contain the first three of the FRAS addresses, since there aren't four usable redundant rows to perform the repair. This situation is as follows:

| | | |
|---|---|---|
| FRAR[0] = FRAS[0] | RR_info[0] = 1 | RR_enable[0] = 1 |
| FRAR[1] = 0 | RR_info[1] = 0 | R_enable[1] = 0 |
| FRAR[2] = FRAS[1] | RR_info[2] = 1 | RR_enable[2] = 1 |
| FRAR[3] = FRAS[2] | RR_info[3] = 1 | RR_enable[3] = 1 |
| FRAS[3] ! | (unrepairable faulty address) | |

This time, the last defective address in FRAS[3] did not get repaired, since the memory has run out of non-defective redundant rows. Unrepaired faulty addresses will be detected during the second BIST run (which tests the repaired memory); at that time, the unrepaired faulty accessible row address will force the BISR FSM control logic to raise the FAIL signal.

A flowchart of the sequence of operations comprising the redundant row allocation process appears in FIGS. 8A–B. When the first BIST run is finished 250, the FLARE unit is disabled 252. Results from the first BIST run are retrieved and counters i and j, which index through the redundant rows and the faulty accessible rows, respectively, are initialized 254. As the allocation of redundant rows proceeds, the counters are checked 258 to determine if the process is complete. If not, RR_info[i] is checked 262, to see if the next redundant row is usable. If so, the $i^{th}$ redundant row is enabled 268 by setting RR_enable[i]=1, and then allocated as a replacement for the $j^{th}$ faulty accessible row 274, by setting FRAR[i]=FRAS[j]. As discussed above, this allows the circuitry of FIG. 7 to substitute the $i^{th}$ redundant row when the $j^{th}$ address is asserted. If RR_info[i]=0, the $i^{th}$ redundant row is not usable (having been found faulty in the first BIST run); in this case, the $i^{th}$ redundant row is disabled 264 by setting RR_enable[i]=0. Counter i is incremented 256, to get the next redundant row, where as counter j is not incremented; counter j is only incremented when RR_info [i]=1. When the counter check 258 determines that the process is complete 260, the FLARE_DONE signal is raised 266, to indicate that the FLARE unit is ready to swap redundant rows for faulty accessible rows. This triggers the start of the second BIST run 270 and 272.

When the BISR FSM control unit detects the FLARE_DONE signal, it enables the BIST unit again to test repaired memory. Throughout the second BIST run (and during normal operation), the FLARE unit remains disabled and never gets reset, so the repair information is retained in the FRAR and RR_enable locations, and redundant rows will be used to replace the defective accessible memory rows.

A number of advantages are believed to result from the method and system described herein. Since a single BIST is used, as opposed to multiple BISTs configured for different array sizes, the size and complexity of the on-chip BIST/BISR circuitry is reduced. Moreover, the BISR Wrapper permits a generic BIST to be used; therefore, the BISR is unaffected by changes in the BIST algorithm. Consequently, designers may more easily incorporate improved BISTs in their memory devices. Furthermore, since the BIST addresses the entire memory array, adjacent row interaction tests can be performed using a checkerboard pattern that spans both the accessible and redundant portions of the memory, greatly improving fault coverage. Resources required for implementation of the BISR Wrapper system disclosed herein are no more extensive than would be needed for implementation of existing BIST/BISR approaches, so its incorporation into memory devices is believed to be straightforward.

It will be appreciated by those skilled in the art having the benefit of this disclosure that this invention is believed to present a system and method for built-in self-test and self-repair of a semiconductor memory. Further modifications and alternative embodiments of various aspects of the invention will be apparent to those skilled in the art in view of this description. Details described herein, such as the number and order of BIST runs, are exemplary of a particular embodiment. It is intended that the following claims be interpreted to embrace all such modifications and changes and, accordingly, the specification and drawings are to be regarded in an illustrative rather than a restrictive sense.

What is claimed is:

1. A self-repair system for a semiconductor memory device, wherein the semiconductor memory comprises:
    a first portion of the memory, comprising an array of m rows and n columns;
    a second portion of the memory, comprising an array of p rows and n columns; and
    test circuitry, comprising a built-in self-test (BIST) engine, configured to test the first and second portions as a single joint array of m+p rows and n columns, and detect rows failing the test;
and wherein the operation of the self-repair system is directed by a hardware embodiment of a finite state machine comprising a programmable logic array, and wherein the self-repair system comprises:
    row allocation circuitry, configured to receive test results from the BIST engine, and create a repair table in which rows from the first portion of memory that have failed the test are associated with rows from the second portion that have passed the test; and
    built-in self-repair (BISR) circuitry, adapted to replace failing rows from the first memory portion with non-failing rows from the second portion, according to the associations in the repair table.

2. The system as recited in claim 1, wherein the repair table comprises a register with p entries, such that there is an entry associated with each row from the second memory portion, and such that each entry in the repair table contains the address of one of the m+p rows tested by the BIST engine.

3. The system, as recited in claim 1, wherein the row allocation circuitry is configured to place the addresses of failing rows from the first memory portion in the entries of the repair table associated with non-failing rows from the second portion.

4. The system as recited in claim 3, wherein, when a row address is received by the BISR that matches one of the repair table entries, the BISR circuitry replaces the addressed row with the row from the second memory portion associated with that entry.

5. The system as recited in claim 4, wherein replacing a first row with a second row comprises redirecting the input/output (I/O) signals from the first row to the second row.

6. The system as recited in claim 1, wherein the entries of the repair table contain row addresses that exceed the size of the first portion of memory, and such that, when the BIST engine asserts these addresses, the BISR circuitry redirects the I/O signals to the second memory portion.

7. The system as recited in claim 1, wherein the BIST engine tests the memory before the repair table is created, and retests it after the repair table is created.

8. The system as recited in claim 7, wherein the BISR circuitry is further adapted to return a "fail" final result if the BIST engine detects a failing row in the first portion of memory during the retest, and to return a "pass" final result otherwise.

9. The system as recited in claim 1, wherein the BIST engine is adapted to test the joint array by writing a bit pattern to the array, reading back the contents of the array, and comparing the contents to the original bit pattern.

10. The system as recited in claim 9, wherein the bit pattern is a sequence of 1's and 0's, alternating row-wise and column-wise.

11. The method as recited in claim 1, wherein the first portion of memory comprises accessible memory and the second first portion of memory comprises redundant memory.

12. A method for self-test and self-repair of a memory comprising first and second arrays, said method comprising:
    testing the entirety of the memory as a single contiguous array, thereby detecting which rows of the first and second arrays fail the test and recording their addresses;
    creating a repair table, such that each entry of the table is associated with a non-failing row from the second array and contains the address of a failing row from the first array;
    replacing each failing row from the first array whose address is contained in a repair table entry by the associated non-failing row from the second array; and
    retesting the entirety of the memory as a single addressable array, ignoring failing rows within the second array.

13. The method as recited in claim 12, wherein a "fail" final result is returned if any rows within the first array fail during retesting, and a "pass" final result is returned otherwise.

14. The method as recited in claim 12, wherein replacing a failing row within the first array with a non-failing row from the second array comprises redirecting the I/O signals of the failing row to the non-failing row.

15. The method as recited in claim 12, wherein, prior to testing the memory, the entries in the repair table contain row addresses extending beyond the address range of the first array to include the rows of the second array.

16. A computer-usable carrier medium, comprising:
    first program instructions defining operations performable by a finite state machine (FSM) for testing the entirety of a memory comprising first and second portions, and for recording the addresses of which rows fail the test;
    second program instructions defining a repair table, said table comprising a register wherein the recorded addresses of failing rows from the first memory portion are associated with non-failing rows from the second portion;
    third program instructions defining operations performable by a repair execution unit for using the repair table to replace failing rows in the first memory portion with non-failing rows from the second portion, wherein replacing a first row by a second row comprises redirecting the input/output (I/O) signals from the first row to the second row; and fourth program instructions defining operations performable by the FSM for retesting the entirety of the memory, and detecting any rows within the first portion that fail the test, while ignoring rows in the second portion that fail.

17. The computer-usable carrier medium as recited in claim 16, wherein the second program instructions further define operations performable by the FSM for returning a "fail" result if a failing row is detected in the first portion of memory during the retest, and returning a "pass" result otherwise.

18. The computer-usable carrier medium as recited in claim 16, wherein said program instructions comprise a hardware description language.

19. The computer-usable carrier medium as recited in claim 16, wherein said program instructions are executable on a computer running a software simulator, such that all possible operations of the execution unit can be simulated.

* * * * *